United States Patent
Hao et al.

(10) Patent No.: US 6,949,471 B2
(45) Date of Patent: Sep. 27, 2005

(54) METHOD FOR FABRICATING POLY PATTERNS

(75) Inventors: Ching-Chen Hao, Hsin-Chu (TW); Hung-Jen Lin, Tainan (TW); Min-Hwa Chi, Hsin-chu (TW); Chih-Heng Shen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 80 days.

(21) Appl. No.: 10/631,251

(22) Filed: Jul. 31, 2003

(65) Prior Publication Data

US 2005/0026406 A1 Feb. 3, 2005

(51) Int. Cl.[7] ............................................... H01L 21/31
(52) U.S. Cl. ........................ 438/758; 438/592; 438/653
(58) Field of Search ................................. 438/758, 592, 438/653

(56) References Cited

U.S. PATENT DOCUMENTS 6,221,768 B1 * 4/2001 Early ......................... 438/659
6,228,751 B1 * 5/2001 Yamazaki et al. ........... 438/585
6,287,986 B1 * 9/2001 Mihara ....................... 438/763
6,417,056 B1 * 7/2002 Quek et al. ................. 438/303
6,436,818 B1 * 8/2002 Hu et al. .................... 438/656
6,465,335 B1 * 10/2002 Kunikiyo .................... 438/592
6,649,538 B1 * 11/2003 Cheng et al. ............... 438/775
6,720,606 B1 * 4/2004 Nitayama et al. .......... 257/306

OTHER PUBLICATIONS

Wu, C.C., et al., "A 90–nm CMOS Device Technology with High–Speed, General–Purpose, and Low–Leakage Transistors for System on Chip Applications," IEDM (Feb. 2002) pp. 65–68.

* cited by examiner

Primary Examiner—Michael Lebentritt
Assistant Examiner—Olivia T Luk
(74) Attorney, Agent, or Firm—Slater & Matsil, L.L.P.

(57) ABSTRACT

A method of fabricating polysilicon patterns. The method includes depositing polysilicon on a substrate. The polysilicon may be doped or pre-doped depending upon the application. A mask layer is applied and patterned. Thereafter, the polysilicon is etched to form the polysilicon patterns and an oxidizing step is performed. The mask layer is removed after the oxidizing step is performed.

29 Claims, 4 Drawing Sheets

METHOD FOR FABRICATING POLY PATTERNS

TECHNICAL FIELD

The present invention relates to the field of semiconductor devices, and more specifically, to the fabrication of polysilicon patterns in semiconductor devices.

BACKGROUND

Complementary metal oxide semiconductor (CMOS) devices, such as metal oxide semiconductor field-effect transistors (MOSFETs), are commonly used in the fabrication of ultra-large scale integrated (ULSI) devices. The continuing trend is to reduce the sizes of the devices and to lower the power consumption requirements. As a result, recent trends have been to utilize ultra-shallow junctions in CMOS devices.

For example, NMOS and PMOS transistors typically have a gate insulator and a gate poly formed on a substrate. The substrate, typically a silicon substrate, is doped on either side of the gate to form the source and drain. Electrodes connect to the gate poly, source, and drain. To keep the CMOS devices as small as possible, the CMOS devices are designed such that the source and drain regions and the insulating films are as small as possible, i.e., the CMOS devices are designed with ultra-shallow junctions.

Furthermore, in many cases, pre-doping is performed to implant n-type impurities in an NMOS device or to implant p-type impurities in a PMOS device in the gate poly that forms the gate electrode. Pre-doping improves the threshold voltage and drive current characteristics, thereby further enhancing the performance of the transistor.

However, n-type pre-doping often results in undesired characteristics in the poly-gate profile. Generally, n-type pre-doping is performed by implanting n-type impurities, such as phosphorous, into the gate poly. Mask layers are applied and patterned to etch the gate. The mask layers are removed and an oxidation step is performed. The removal of the mask layer, however, frequently results in a "necking" or "footing" of the gate profile, i.e., the sidewalls of the gate are not vertical, thereby causing device deviation due to inconsistent dopant penetration.

For example, FIG. 1 illustrates a wafer 100 with a gate structure formed thereon after an n-type pre-doping process has been performed. A substrate 110 has a gate insulator 112 formed thereon. A gate 114 is formed on the gate insulator 112, and an oxide layer is formed on the exposed areas of the gate 114 and the gate insulator 112. A neck 118 is formed on the upper portion of the gate 114. The neck 118 induces the n+ dopant to be driven to the n-light doped drain (NLDD) area, which induces poly-finger junction leakage.

SUMMARY OF THE INVENTION

These and other problems are generally reduced, solved or circumvented, and technical advantages are generally achieved, by embodiments of the present invention, which provides a method of fabricating poly patterns.

In one embodiment of the present invention, an oxidizing step is performed after a poly structure has been formed and before removing the mask. The oxidizing prevents the necking problem commonly formed when removing the mask, thereby decreasing the finger-junction leakage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
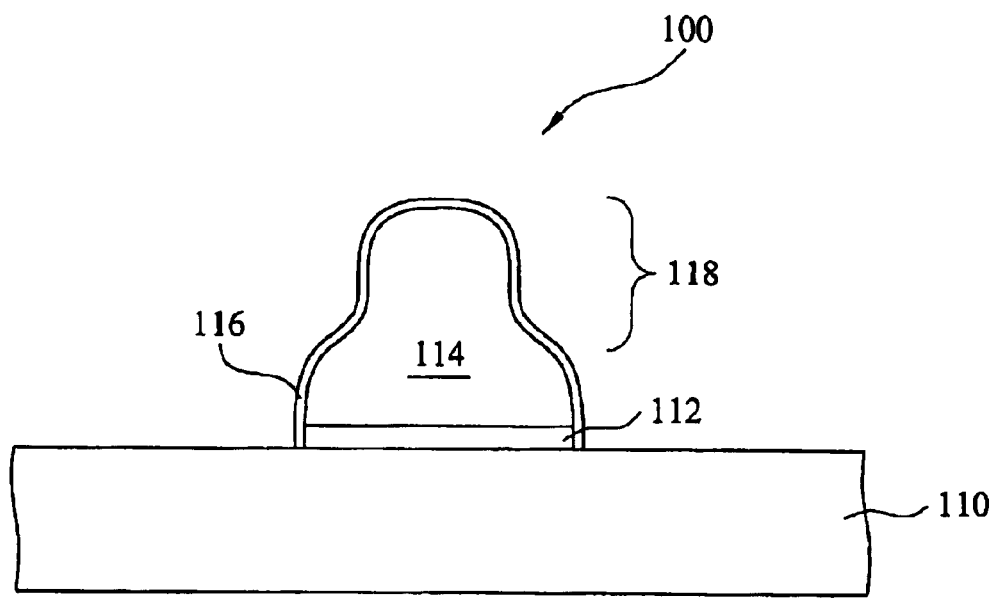
FIG. 1 is a cross-section view of a wafer illustrating a structure having a necking profile.

The making and using of the presently preferred embodiments are discussed in detail below. It should be appreciated, however, that the present invention provides many applicable inventive concepts that can be embodied in a wide variety of specific contexts. In particular, the method of the present invention is described in the context of forming a gate of a transistor. One of ordinary skill in the art, however, will appreciate that the process described herein may be used for forming any type of device or structure that utilizes n-type pre-doped polysilicon structures. Accordingly, the specific embodiments discussed herein are merely illustrative of specific ways to make and use the invention, and do not limit the scope of the invention.

FIGS. 2a–2e illustrate cross-section views of a portion of a semiconductor wafer during various steps of a first method embodiment of the present invention. The process begins in FIG. 2a, wherein a semiconductor wafer 200 having a substrate 210 with a gate insulator layer 212 and a gate layer 214 formed thereon. The substrate 210 may be other semiconductors: silicon, glass, GaAs, silicon-on-insulator (SOI), or the like, but preferably silicon.

The gate insulator layer 212, which prevents electron depletion, is preferably an oxide layer formed by any oxidation process, such as wet or dry thermal oxidation in an ambient comprising an oxide, $H_2O$, NO, or a combination thereof, or by chemical vapor deposition (CVD) techniques using is tetra-ethyl-ortho-silicate (TEOS) and oxygen as a precursor. In the preferred embodiment, however, the gate insulator layer 212 is silicon dioxide material formed by wet or dry oxidation process, such as a furnace oxidation in an ambient environment of $O_2$, $H_2O$, a combination thereof, or the like, or an in-situ steam generation (ISSG) process in an ambient environment of $O_2$, $H_2O$, NO, a combination thereof, or the like. In the preferred embodiment, the gate insulator layer is about 15 Å to about 25 Å, but most preferably about 20 Å in thickness.

The gate layer 214 is generally a semiconductor material such as polysilicon, amorphous silicon, or the like. In the preferred embodiment, polysilicon is deposited undoped by low-pressure chemical vapor deposition (LPCVD) to a thickness in the range of about 2500 Å to about 1500 Å, but most preferably about 1800 Å.

In the preferred embodiment in which the gate layer 214 comprises a polysilicon material, the polysilicon is pre-doped with phosphorous ions at a dose of about $3.0e^{15}$ to about $6.0e^{15}$ atoms/cm$^2$ and at an energy of about 10 to about 30 KeV. Alternatively, the gate layer 214 may be pre-doped using nitrogen, arsenic, antimony, or the like.

Optionally, the gate layer 214 may be patterned prior to pre-doping to restrict ion implantation to pre-determined areas of the gate layer 214. For example, if multiple devices are being formed that require varying levels of doping or varying types of doping (e.g., N-type doping, P-type doping, no doping, and the like), a mask layer (not shown) may be utilized to selectively dope the gate layer 214.

Figure 2A:
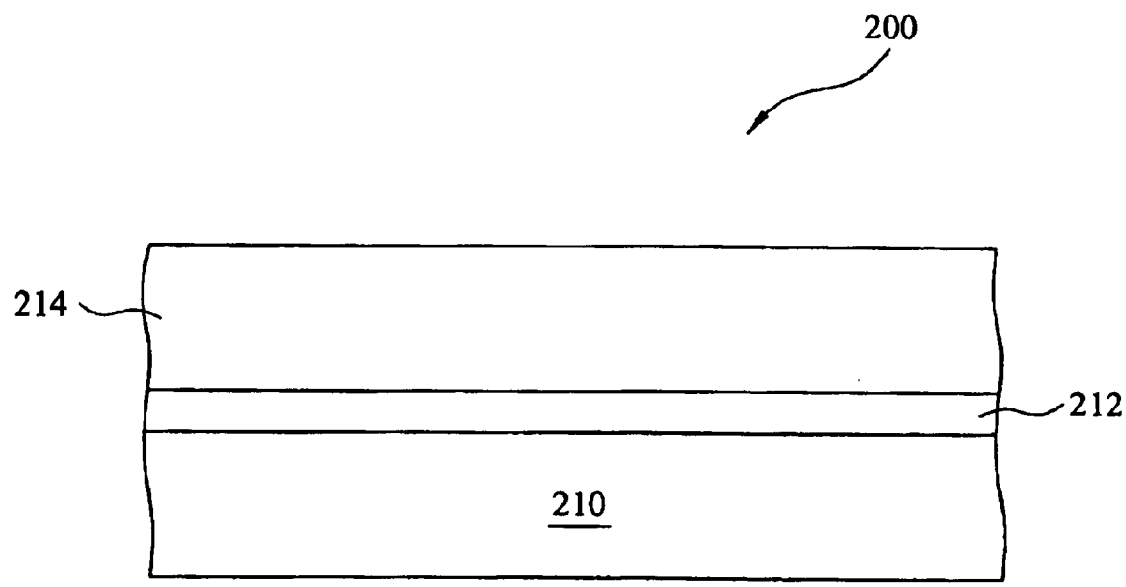
FIGS. 2a–2e are cross-section views of a wafer illustrating a process of forming polysilicon structures in accordance with one method embodiment of the present invention.
Figure 2B:
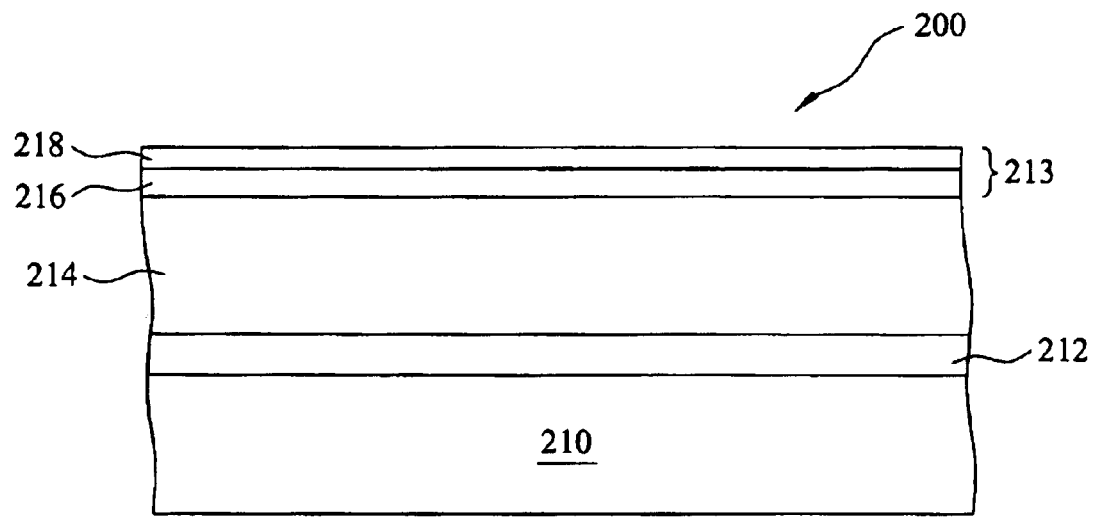

FIG. 2b illustrates the wafer 200 after a mask layer 213 has been applied in accordance with an embodiment of the present invention. The mask layer 213 protects the underlying gate layer 214 during subsequent processing steps, such as etching, to form the desired structures. In the preferred embodiment, the mask layer 213 comprises a plasma-enhanced oxide (PEOX) layer 216 and a silicon oxynitride (SION) layer 218, but other mask layers may be used, such as photoresist, TEOS oxide, or the like. The PEOX layer 216 is preferably about 200 Å to about 300 Å in thickness, but most preferably about 260 Å in thickness. The SION layer 218 is preferably about 100 Å to about 200 Å in thickness, but most preferably is about 150 Å in thickness. The PEOX layer 216 and the SION layer 218 may be deposited by any suitable method known in the art such as CVD-Nitride.

Figure 2C:
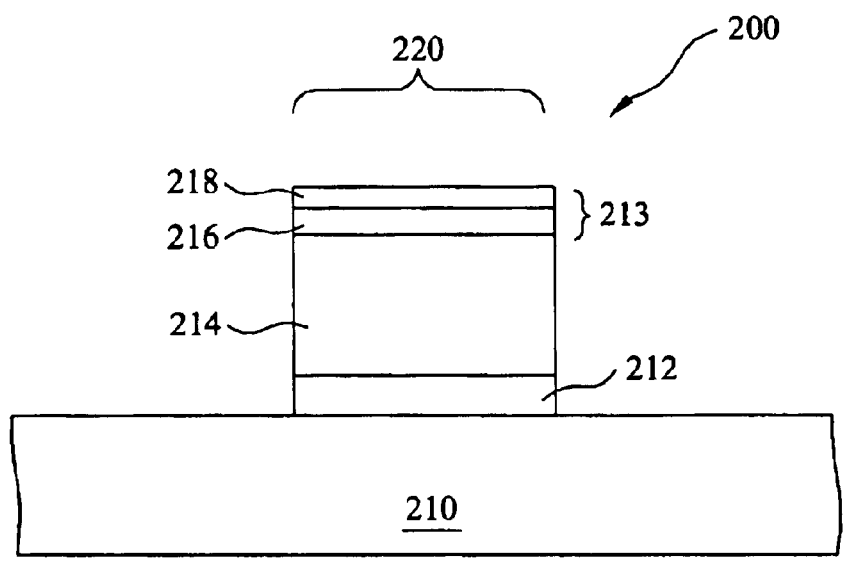

FIG. 2c illustrates wafer 200 of FIG. 2b after the gate insulator layer 212 and gate layer 214 have been etched in accordance with one embodiment of the present invention. In the preferred embodiment, the gate insulator layer 212 and gate layer 214 are patterned and etched to form a gate structure 220. To pattern the gate insulator layer 212 and gate layer 214, a patterned mask (not shown), such as a photoresist mask, may be formed on the mask layer 213. In the situation wherein a photoresist process is used, a photoresist material is deposited on the SION layer 218, exposed in accordance with a mask, and developed to remove the unwanted areas of the photoresist material.

After the SION layer 218 and PEOX layer 216 have been patterned, the wafer is etched to remove unwanted portions of the gate insulator layer 212, gate layer 214, PEOX layer 216, and SION layer 218. The etching process may be a wet or dry, anisotropic or isotropic, etch process, but preferably is an anisotropic dry etch process.

Figure 2D:
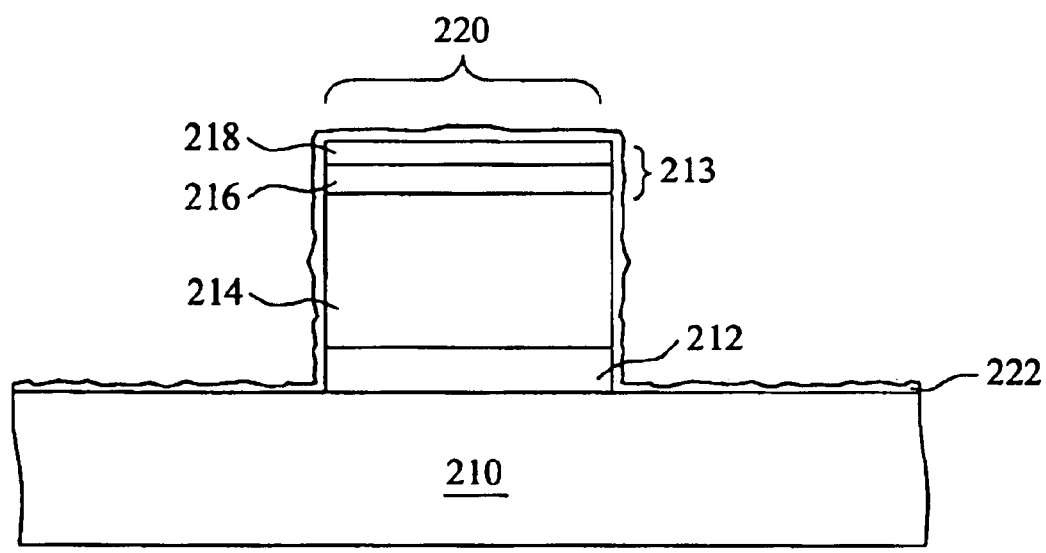

FIG. 2d illustrates wafer 200 of FIG. 2c after an oxidation step has been performed in accordance with an embodiment of the present invention. The oxidized regions 222 are generally formed on the substrate 210 and along the sidewalls of gate structure 220. The oxidized regions 222 form a protective barrier layer on top of the substrate 210 and along the sidewalls of the gate structure 220 during succeeding steps.

Oxidation may be performed by any oxidation process, such as wet or dry thermal oxidation. Preferably, however, a dry oxidation step, such as a furnace anneal, a rapid thermal oxidation (RTO), or the like, is performed. Most preferably, an RTO process is performed at a temperature of about 900° to 1010° C. with an ambient comprising an oxide, $O_2$ a combination thereof, or the like, for a duration of about 5 seconds to about 15 seconds. The oxidized region 222 is preferably about 15 Å to about 25 Å in thickness.

Figure 2E:
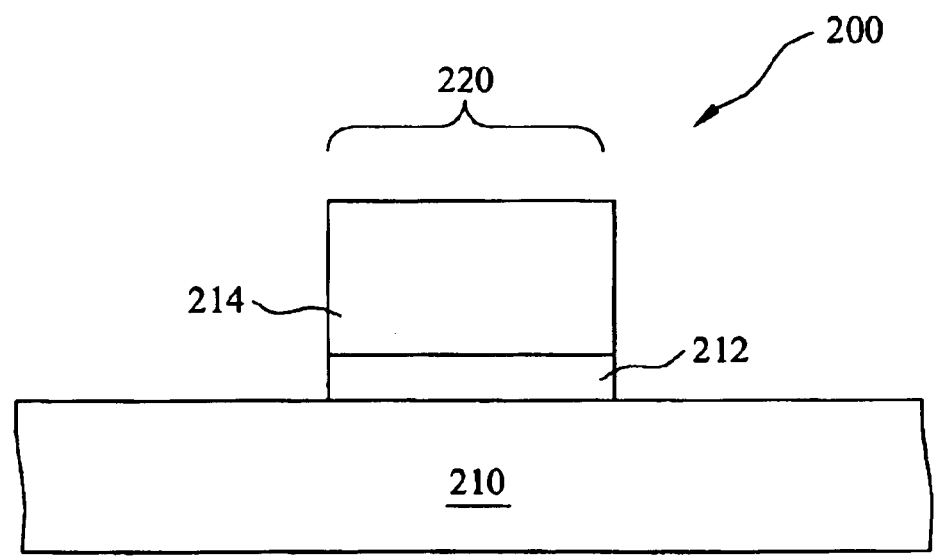

FIG. 2e illustrates wafer 200 of FIG. 2c after the mask layer 213 has been removed in accordance with an embodiment of the present invention. In the preferred embodiment wherein the mask layer 213 comprises a PEOX layer 216 and a SION layer 218, the mask layer 213 is preferably removed by performing a wet dip in phosphoric acid ($H_3PO_4$) for about 8 minutes to about 12 minutes, but most preferably about 10 minutes. The removal of the mask layer 213 may cause the oxidation layer 222 along the side of the gate structure 220 and the substrate 210 to be partially or entirely removed. The sidewalls of the gate structure 220 should remain substantially vertical after the removal of the mask layer 213, providing a better finger-junction profile and reduced poly finger junction leakage.

Thereafter, standard processing steps such as doping, oxidation, etching, layering, and the like, may be performed to fabricate semiconductor devices, such as transistors.

Figure 3:
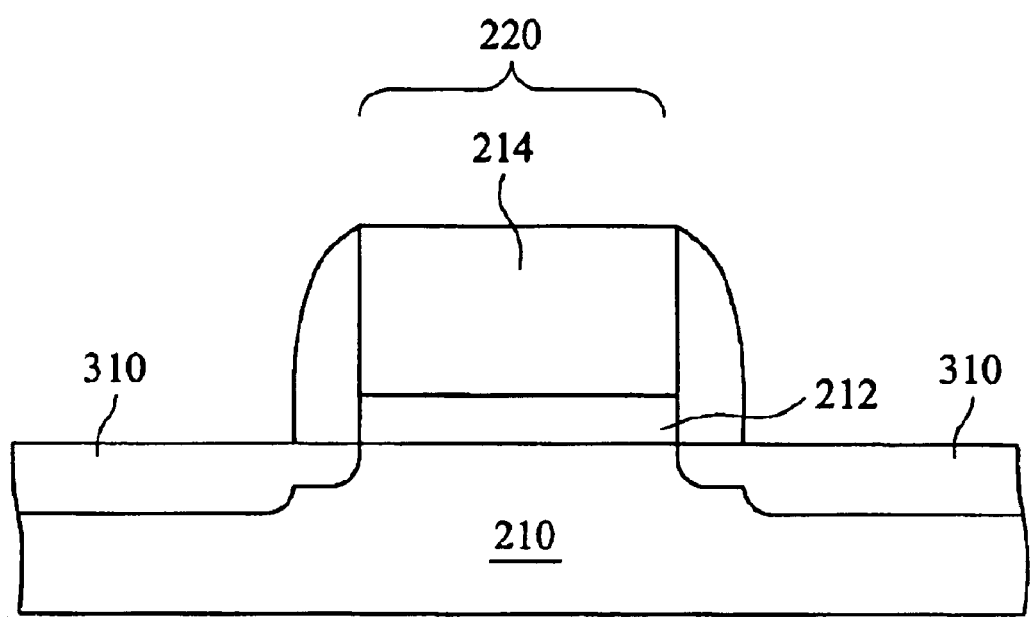
FIG. 3 is a cross-section view of a transistor fabricated in accordance with one embodiment of the present invention.

FIG. 3 illustrates a transistor 300 that may be formed in accordance with one embodiment of the present invention discussed above with reference to FIGS. 2a–2e, wherein like reference numerals refer to like elements. In this case, the gate insulator layer 212 and gate layer 214, collectively referred to as a gate 308, form a gate of a transistor. The substrate 210 contains doped areas 310 (source/drain) that represent the source and drain of the transistor 300. The insulator regions 312 along the sidewalls of the gate 308 provide spacers for the gate 308.

Although particular embodiments of the invention have been described in detail, it is understood that the invention is not limited correspondingly in scope, but includes all changes, modifications, and equivalents coming within the spirit and terms of the claims appended hereto. For example, differing types of mask materials and photoresist materials may be used, varying thicknesses of the gate layer, gate insulator layer, and, mask layer, may be used, and the like. Accordingly, it is understood that this invention may be extended to other structures and materials, and thus, the specification and figures are to be regarded in an illustrative rather than a restrictive sense.

What is claimed is:

1. A method of forming a semiconductor device, the method comprising:

forming a structure on a wafer, the structure having a first layer and a mask layer formed on the first layer, the first layer having a layer formed of pre-doped polysilicon;

oxidizing the wafer creating an oxidized layer prior to removing the mask layer; and removing the oxidized layer and the mask layer positioned over the structure.

2. The method of claim 1 wherein the first layer is about 1500 Å to about 2500 Å to about 2500 Å in thickness.

3. The method of claim 1 wherein the first layer is about 1800 Å in thickness.

4. The method of claim 1 wherein the pre-doped polysilicon is pre-doped with a material selected from the group consisting essentially of phosphorous, nitrogen, arsenic, and antimony.

5. The method of claim 1 wherein the structure is a gate structure and includes an insulator layer.

6. The method of claim 5 wherein the insulator layer is formed of a material selected from the group consisting essentially of oxide, silicon dioxide, and combinations thereof.

7. The method of claim 1 wherein oxidizing is performed by rapid thermal oxidation (RTO).

8. The method of claim 7 wherein RTO is performed at a temperature about 900° C. to about 1010° C.

9. The method of claim 7 wherein RTO is performed for about 5 seconds to about 15 seconds.

10. The method of claim 1 wherein removing the mask layer is performed by a wet dip in phosphoric acid.

11. The method of claim 1 wherein the mask layer includes a plasma-enhanced oxygen (PEOX) layer and a silicon oxynitride (SiON) layer.

12. The method of claim 11 wherein the PEOX layer is about 200 Å to about 300 Å in thickness.

13. The method of claim 11 wherein the PEOX layer is about 260 Å in thickness.

14. The method of claim 11 wherein the SiON layer is about 100 Å to about 200 Å in thickness.

15. The method of claim 11 wherein the SiON layer is about 150 Å in thickness.

16. A method of forming a semiconductor device on a wafer having a substrate, the method comprising:

forming a gate oxide on the substrate;

forming a polysilicon layer on the gate oxide;

pre-doping the polysilicon layer;

forming a mask layer on the polysilicon layer;

patterning the mask layer, thereby exposing portions of the polysilicon layer, at least a portion of the mask layer remaining on a portion of the polysilicon layer;

etching exposed regions of the polysilicon layer and the gate oxide;

oxidizing the wafer creating an oxidized layer prior to removing the mask layer; and removing the mask layer and the oxidized layer over remaining portions of the polysilicon layer.

17. The method of claim 16 wherein pre-doping is performed with a material selected from the group consisting essentially of phosphorous, nitrogen, arsenic, and antimony.

18. The method of claim 16 wherein the polysilicon layer formed on an insulator layer is formed of a material selected from the group consisting essentially of oxide, silicon dioxide, and combinations thereof.

19. The method of claim 16 wherein oxidizing is performed by rapid thermal oxidation (RTO).

20. The method of claim 19 wherein RTO is performed at a temperature about 900° C. to about 1010° C.

21. The method of claim 19 wherein RTO is performed for about 5 seconds to about 15 seconds.

22. The method of claim 16 wherein removing the mask layer is performed by a wet dip in phosphoric acid.

23. The method of claim 16 wherein the polysilicon layer is about 1500 Å to about 2500 Å in thickness.

24. The method of claim 16 wherein the polysilicon layer about 1800 Å in thickness.

25. The method of claim 16 wherein the mask layer includes a plasma-enhanced oxygen (PEOX) layer and a silicon oxynitride (SiON) layer.

26. The method of claim 25 wherein the PEOX layer is about 200 Å to about 300 Å in thickness.

27. The method of claim 25 wherein the PEOX layer is about 260 Å in thickness.

28. The method of claim 25 wherein the SiON layer is about 100 Å to about 200 Å in thickness.

29. The method of claim 25 wherein the SiON layer is about 150 Å in thickness.

* * * * *